United States Patent
Zegarra et al.

(10) Patent No.: US 12,119,558 B2
(45) Date of Patent: *Oct. 15, 2024

(54) INTEGRATED ANTENNA MODULE

(71) Applicant: QUALCOMM Incorporated, San Diego, CA (US)

(72) Inventors: Julio Zegarra, La Jolla, CA (US); Peter Lien, Carlsbad, CA (US); Sang-June Park, San Diego, CA (US); Darryl Sheldon Jessie, San Diego, CA (US); Alberto Cicalini, Tortona (IT); Sean Oak, Lakeside, CA (US); Neil Burns, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/174,470

(22) Filed: Feb. 24, 2023

(65) Prior Publication Data

US 2024/0022008 A1    Jan. 18, 2024

Related U.S. Application Data

(62) Division of application No. 16/825,615, filed on Mar. 20, 2020, now Pat. No. 11,594,824.

(60) Provisional application No. 62/916,681, filed on Oct. 17, 2019.

(51) Int. Cl.
*H01Q 23/00* (2006.01)
*H01Q 1/48* (2006.01)
*H01Q 1/52* (2006.01)
*H05K 1/18* (2006.01)

(52) U.S. Cl.
CPC ............... *H01Q 23/00* (2013.01); *H01Q 1/48* (2013.01); *H01Q 1/526* (2013.01); *H05K 1/189* (2013.01)

(58) Field of Classification Search
CPC ....... H01Q 1/241–243; H01Q 1/38–48; H01Q 1/523–526; H01Q 23/00
See application file for complete search history.

(56) References Cited

U.S. PATENT DOCUMENTS

| | | |
|---|---|---|
| 8,500,630 B2 | 8/2013 | Gilad et al. |
| 10,334,743 B2 | 6/2019 | Ryou |
| 11,122,694 B2 | 9/2021 | Min et al. |
| 11,495,873 B2 | 11/2022 | Han et al. |
| 2015/0163937 A1 | 6/2015 | McClatchie et al. |
| 2017/0358847 A1 | 12/2017 | Cho et al. |
| 2018/0159209 A1 | 6/2018 | Mikata et al. |
| 2019/0103653 A1 | 4/2019 | Jeong et al. |

(Continued)

FOREIGN PATENT DOCUMENTS

WO     2018207500 A1     11/2018

OTHER PUBLICATIONS

International Search Report and Written Opinion—PCT/US2021/019046—ISA/EPO—Jul. 6, 2021.

*Primary Examiner* — Hasan Islam
(74) *Attorney, Agent, or Firm* — Muncy, Geissler, Olds, Lowe

(57) ABSTRACT

An integrated millimeter wave antenna module may include at least one antenna array connected to a wiring board with a flexible printed circuit without any additional connectors. The integrated module may include an antenna, a flexible printed circuit attached to the antenna on one end and a wiring board on the other end.

7 Claims, 13 Drawing Sheets

(56) References Cited

U.S. PATENT DOCUMENTS

| | | |
|---|---|---|
| 2020/0015357 A1 | 1/2020 | Kim et al. |
| 2020/0021015 A1 | 1/2020 | Yun et al. |
| 2020/0136238 A1 | 4/2020 | Iwata |
| 2020/0227811 A1* | 7/2020 | Dalmia ................ H01Q 21/28 |
| 2020/0266521 A1 | 8/2020 | Jeong et al. |
| 2021/0119350 A1 | 4/2021 | Zegarra et al. |
| 2021/0280959 A1 | 9/2021 | Han et al. |
| 2021/0344783 A1 | 11/2021 | Jeong et al. |
| 2023/0155273 A1 | 5/2023 | Han et al. |

* cited by examiner

INTEGRATED ANTENNA MODULE

CROSS-REFERENCE TO RELATED APPLICATIONS

The present application for patent is a Divisional application of U.S. application Ser. No. 16/825,615 filed Mar. 20, 2020, which claims the benefit of Provisional Application No. 62/916,681 entitled "INTEGRATED ANTENNA MODULE" filed Oct. 17, 2019, assigned to the assignee hereof, and each of which is incorporated herein by reference in its entirety.

FIELD OF DISCLOSURE

This disclosure relates generally to antennas, and more specifically, but not exclusively, to integrated antenna modules and circuit boards.

BACKGROUND

In modern telecommunication devices, it is known to provide an antenna on a flexible printed circuit board (PCB) or printed wiring board (PWB). Such antennas provide benefits such as the relatively small size and complex pattern of the antenna. Such antennas are typically mounted to a board using separate connectors. Current mm-Wave antenna modules, for example, require separate flex boards and connectors to communicate with the radio frequency (RF) integrated circuit (IC) chip. In addition, the total number of modules needed is usually 3 or 4 depending on the coverage requirements of the design with each individual module needing 1 flexible cable and 2 connectors (one on either end of the flexible cable). During manufacturing, all those parts are procured from separate suppliers and assembled individually. This leads to increased cost and assembly time. In addition, the assembled product typically suffers from electromagnetic (EM) loss associated with the connectors. For example, using 2 connectors (one on each end of the flexible cable) increases costs associated with the cost to manufacture those connectors and the cost/time to assembly/connect them. In addition, since the parts typically come from separate entities, there is an impedance mismatch that results in EM loss.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an antenna module comprises: a wiring board; a transceiver attached to the wiring board; a first antenna configured to transmit and receive signals in a millimeter wave length range; and a first flexible printed circuit directly coupled to the first antenna on a first end and directly coupled to the wiring board on a second end opposite the first end.

In another aspect, an antenna module comprises: a wiring board; a transceiver attached to the wiring board; first means for transmitting and receiving signals in a millimeter wave length range; and first means for connection directly coupled to the first means for transmitting and receiving signals on a first end and directly coupled to the wiring board on a second end opposite the first end.

In still another aspect, a method for manufacturing an antenna module comprises: providing a first copper layer; applying a first shield layer on a first side of the first copper layer; applying a second shield layer on a second side of the first copper layer; applying a ground layer on the second shield layer; applying a plurality of high performance layers on a portion of the first shield layer; attaching a transceiver to the plurality of high performance layers; and coupling a first antenna configured to transmit and receive signals in a millimeter wave length range directly to the first copper layer, the first shield layer, the second shield layer, and the ground layer.

In still another aspect, a non-transitory computer-readable medium comprising instructions that when executed by a processor cause the processor to perform a method comprising: providing a first copper layer; applying a first shield layer on a first side of the first copper layer; applying a second shield layer on a second side of the first copper layer; applying a ground layer on the second shield layer; applying a plurality of high performance layers on a portion of the first shield layer; attaching a transceiver to the plurality of high performance layers; and coupling a first antenna configured to transmit and receive signals in a millimeter wave length range directly to the first copper layer, the first shield layer, the second shield layer, and the ground layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
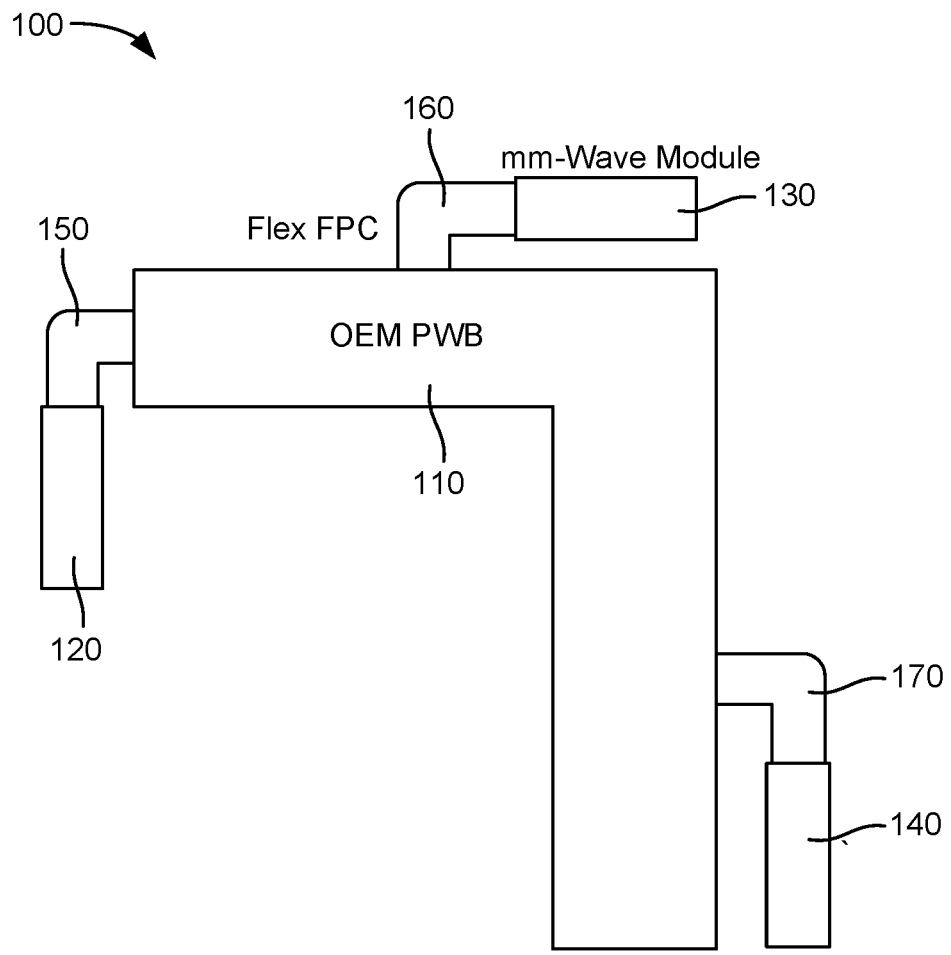
FIGS. 1A-C illustrate an exemplary L shaped antenna module in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, an integrated millimeter wave antenna module may include at least one antenna array directly connected to a wiring board with a flexible printed circuit without any additional connectors. The integrated module may include an antenna, a flexible printed circuit attached to the antenna on one end and a wiring board on the other end.

Figure 1B:
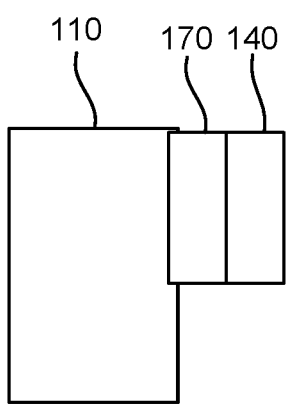
Figure 1C:
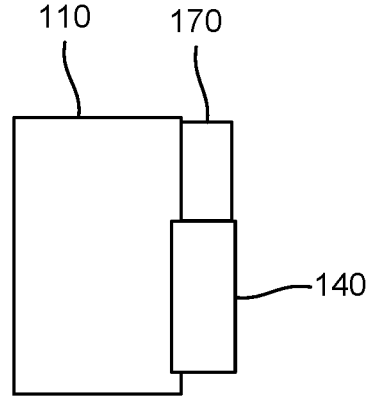

FIGS. 1A-C illustrate an exemplary L shaped antenna module in accordance with some examples of the disclosure. As shown in FIG. 1A, an antenna module 100 may include a wiring board 110 (e.g., a printed wiring board (PWB), a printed circuit board (PCB), or similar), a first antenna 120, a second antenna 130, and a third antenna 140. The first antenna 120, the second antenna 130, and the third antenna 140 may be millimeter (mm) wave antennas configured to transmit and receive signals in the millimeter wavelength range (i.e., 30-300 GHz frequency range or 1 mm-1 cm wavelength). While three are shown in FIG. 1A, it should be understood that more or less than 3 may be included. In addition, the antennas are shown on different sides of the wiring board 110 to avoid interference with each other as well as interference from other materials such as a user's hand etc. While the wiring board 110 is shown as an L-shaped board, it should be understood that the wiring board 110 may be any shape, such as a rectangle or square. The wiring board 110 may be rigid or more rigid than the flexible printed circuits and may include other components typically found on wiring boards such as a transceiver, modem, super heterodyne receiver (to down convert or up convert radio signals), redistribution layer, routing lines, and other circuit elements. The wiring board 110 may also include additional layers such as a high performance layers that allow high speed signal routing using matching dielectric constants between layers (low Dk less than 12), low profile copper traces (lower profile than traditional routing, roughness profile of less than 1.25 μm), and low dissipation factor resin. The wiring board 110 may also include low cost digital routing layers. In addition, these high performance and digital routing layers may also be included on the antennas themselves. Examples of low dissipation factor resin composition (Df of below 5, for example) include: (A) 100 to 150 parts by weight of a vinyl-containing compound or a polymer thereof; (B) 0 to 75 parts by weight of styrene-butadiene-divinylbenzene terpolymer, styrene-butadiene-maleic anhydride terpolymer, vinyl functional polybutadiene urethane oligomer or a combination thereof; (C) 30 to 150 parts by weight of flame retardant; and (D) 0.1 to 10 parts by weight of peroxide.

The antenna module 100 may also include a first flexible printed circuit 150 (FPC) directly coupled to the first antenna 120 on a first end and directly coupled to the wiring board 110 on a second end opposite the first end; a second flexible printed circuit 160 directly coupled to the second antenna 130 on a first end and directly coupled to the wiring board 110 on a second end opposite the first end, wherein the second antenna 130 is located on a first side of the wiring board 110 and the first antenna 120 is located on a second side of the wiring board 110 different from the first side of the wiring board 110; and a third flexible printed circuit 170 directly coupled to the third antenna 140 on a first end and directly coupled to the wiring board 110 on a second end opposite the first end, wherein the third antenna 140 is located on a third side of the wiring board 110 different from the first side and second side of the wiring board 110. Each of the first flexible printed circuit 120, the second flexible printed circuit 130, and the third flexible printed circuit 140 comprises one or more flexible layers, such as 4 layers with a copper layer between a first shield layer and a second shield layer, and a ground layer on the second shield layer opposite the copper layer. Without the use of connectors, the antenna module 100 may be manufactured in less time for less cost and with less loss caused by conventional connectors. The shield layers may insulate the signals on the copper layer as well as protect the copper layer from physical damage.

It should be understood that the configuration or orientation of the flexible printed circuit and associated antenna may be other than shown in FIG. 1A. For example, FIGS. 1B and 1C show alternative arrangements for the third flexible printed circuit 170 coupled to the third antenna 140 and the wiring board 110 wherein the shape and location respective to the antenna and the wiring board are configurable based on other criteria such as available space in a mobile phone casing.

Figure 2:
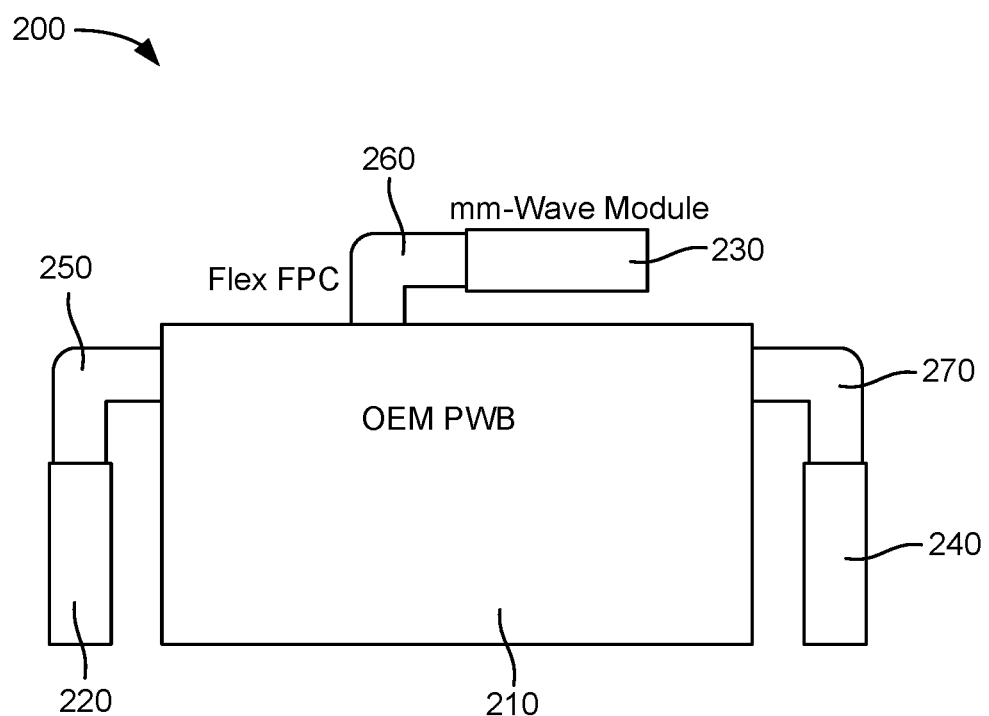
FIG. 2 illustrates an exemplary rectangular shaped antenna module in accordance with some examples of the disclosure.

FIG. 2 illustrates an exemplary rectangular shaped antenna module in accordance with some examples of the disclosure. As shown in FIG. 2, an antenna module 200 (e.g., antenna module 100) may include a wiring board 210 (e.g., a printed wiring board (PWB), a printed circuit board (PCB), or similar), a first antenna 220, a second antenna 230, and a third antenna 240. The first antenna 220, the second antenna 230, and the third antenna 240 may be millimeter (mm) wave antennas configured to transmit and receive signals in the millimeter wavelength range (i.e., 30-300 GHz frequency range or 1 mm-1 cm wavelength). While the wiring board 210 is shown as a rectangle shaped board, it should be understood that the wiring board 210 may be any shape, such as a polygon.

The antenna module 200 may also include a first flexible printed circuit 250 (FPC) directly coupled to the first antenna 220 on a first end and directly coupled to the wiring board 210 on a second end opposite the first end; a second flexible printed circuit 260 directly coupled to the second antenna 230 on a first end and directly coupled to the wiring board 210 on a second end opposite the first end, wherein the second antenna 230 is located on a first side of the wiring board 210 and the first antenna 220 is located on a second side of the wiring board 210 different from the first side of the wiring board 210; and a third flexible printed circuit 270 directly coupled to the third antenna 240 on a first end and directly coupled to the wiring board 210 on a second end opposite the first end, wherein the third antenna 240 is located on a third side of the wiring board 210 different from the first side and second side of the wiring board 210. Each of the first flexible printed circuit 220, the second flexible printed circuit 230, and the third flexible printed circuit 240 comprises one or more flexible layers, such as 4 layers with a copper layer between a first shield layer and a second shield layer, and a ground layer on the second shield layer opposite the copper layer. Without the use of connectors, the antenna module 200 may be manufactured in less time for less cost and with less loss caused by conventional connectors. The shield layers may insulate the signals on the copper layer as well as protect the copper layer from physical damage.

Figure 3:
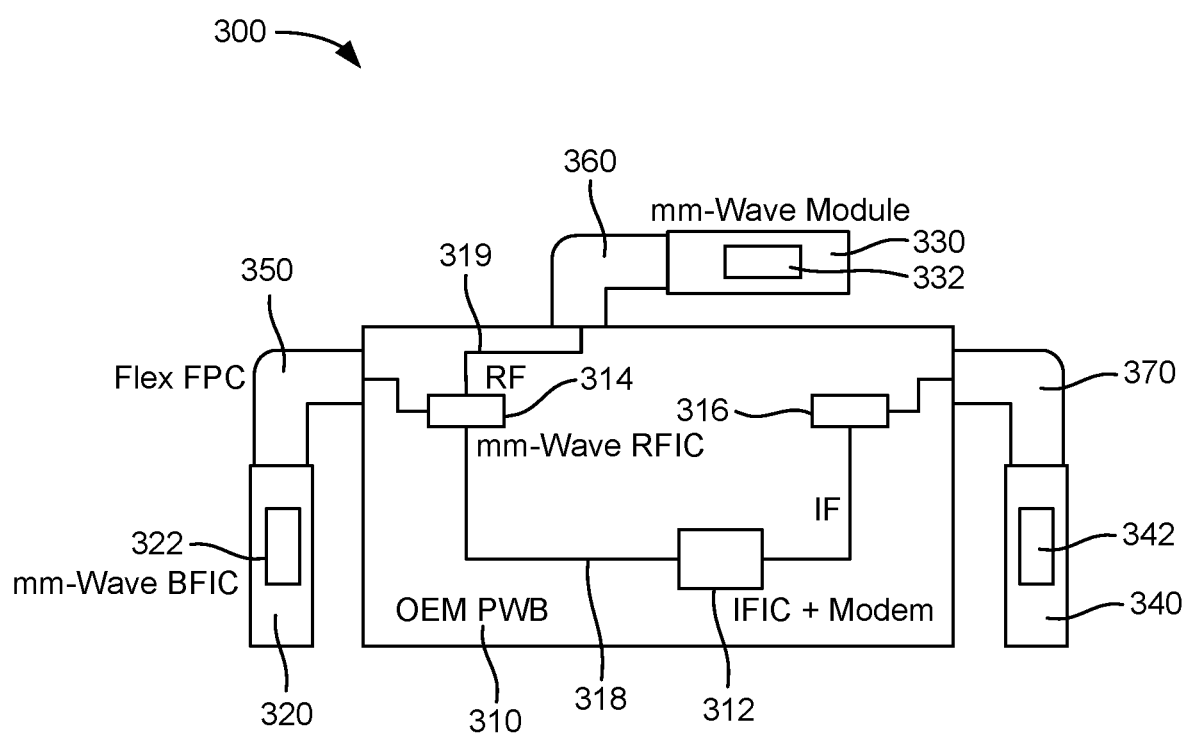
FIG. 3 illustrates an exemplary antenna module with a base frequency IC on the antenna in accordance with some examples of the disclosure.

FIG. 3 illustrates an exemplary antenna module with a base frequency IC on the antenna in accordance with some examples of the disclosure. As shown in FIG. 3, an antenna module 300 (e.g., antenna module 200) may include a wiring board 310, a first antenna 320, a second antenna 330, and a third antenna 340. The antenna module 300 may also include a first flexible printed circuit 350 (FPC) directly coupled to the first antenna 320 on a first end and directly coupled to the wiring board 310 on a second end opposite the first end; a second flexible printed circuit 360 directly coupled to the second antenna 330 on a first end and directly coupled to the wiring board 310 on a second end opposite the first end, wherein the second antenna 330 is located on a first side of the wiring board 310 and the first antenna 320 is located on a second side of the wiring board 310 different from the first side of the wiring board 310; and a third flexible printed circuit 370 directly coupled to the third antenna 340 on a first end and directly coupled to the wiring board 310 on a second end opposite the first end, wherein the third antenna 340 is located on a third side of the wiring board 310 different from the first side and second side of the wiring board 310.

In addition, antenna module 300 may include an intermediate frequency (IF) integrated circuit (IC) with modem 312 for receiving and generating radio signals, a first transceiver 314 (e.g., super heterodyne receiver), a second transceiver 316, radio frequency (RF) routing 319 coupling the first transceiver 314 and the second transceiver 316 to one or more FPCs (RF is the operating frequency on the antennas), and IF routing 318 coupling the IF IC modem to the first transceiver 314 and the second transceiver 316. The antenna module 300 may also include a first base frequency (baseband) IC 322 on the first antenna 320, a second base frequency (BF) (or baseband, BB) IC 332 on the second antenna 330, and a third base frequency (baseband) IC 342 on the third antenna 340.

Figure 4:
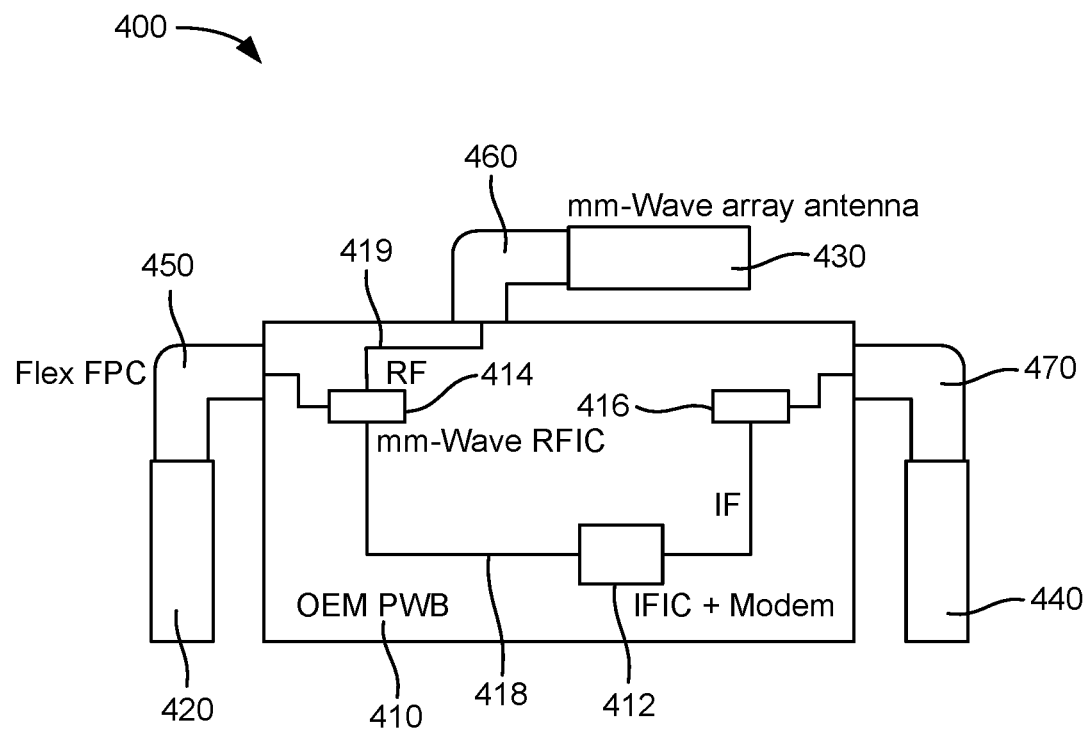
FIG. 4 illustrates an exemplary antenna module with no IC on the antenna in accordance with some examples of the disclosure.

FIG. 4 illustrates an exemplary antenna module with no IC on the antenna in accordance with some examples of the disclosure. As shown in FIG. 4, an antenna module 400 (e.g., antenna module 200) may include a wiring board 410, a first antenna 420, a second antenna 440, and a third antenna 440. The antenna module 400 may also include a first flexible printed circuit 450 (FPC) directly coupled to the first antenna 420 on a first end and directly coupled to the wiring board 410 on a second end opposite the first end; a second flexible printed circuit 460 directly coupled to the second antenna 430 on a first end and directly coupled to the wiring board 410 on a second end opposite the first end, wherein the second antenna 430 is located on a first side of the wiring board 410 and the first antenna 420 is located on a second side of the wiring board 410 different from the first side of the wiring board 410; and a third flexible printed circuit 470 directly coupled to the third antenna 440 on a first end and directly coupled to the wiring board 410 on a second end opposite the first end, wherein the third antenna 440 is located on a third side of the wiring board 410 different from the first side and second side of the wiring board 410.

In addition, antenna module 400 may include an intermediate frequency (IF) integrated circuit (IC) with modem 412 for receiving and generating radio signals, a first transceiver 414 (e.g., super heterodyne receiver), a second transceiver 416, radio frequency (RF) routing 419 coupling the first transceiver 414 and the second transceiver 416 to one or more FPCs (RF is the operating frequency on the antennas), and IF routing 418 coupling the IF IC modem to the first transceiver 414 and the second transceiver 416.

Figure 5:
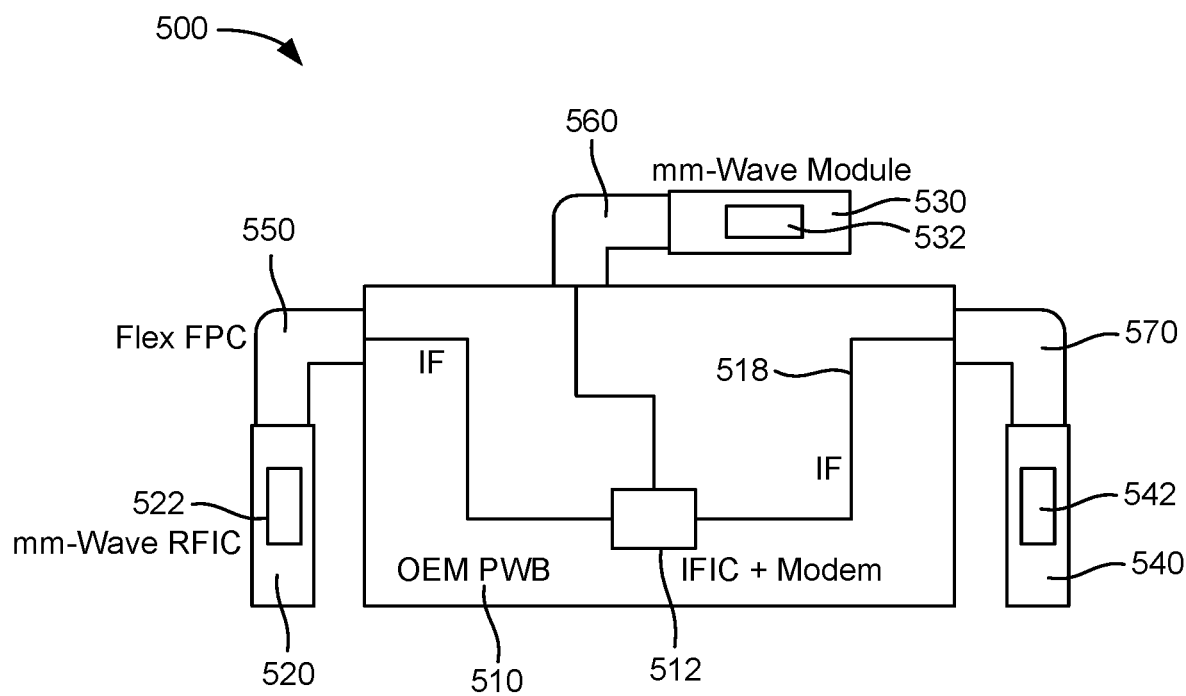
FIG. 5 illustrates an exemplary antenna module with a radio frequency IC on the antenna in accordance with some examples of the disclosure.

FIG. 5 illustrates an exemplary antenna module with a radio frequency IC on the antenna in accordance with some examples of the disclosure. As shown in FIG. 5, an antenna module 500 (e.g., antenna module 200) may include a wiring board 510, a first antenna 520, a second antenna 550, and a third antenna 540. The antenna module 500 may also include a first flexible printed circuit 550 (FPC) directly coupled to the first antenna 520 on a first end and directly coupled to the wiring board 510 on a second end opposite the first end; a second flexible printed circuit 560 directly coupled to the second antenna 530 on a first end and directly coupled to the wiring board 510 on a second end opposite the first end, wherein the second antenna 530 is located on a first side of the wiring board 510 and the first antenna 520 is located on a second side of the wiring board 510 different from the first side of the wiring board 510; and a third flexible printed circuit 570 directly coupled to the third antenna 540 on a first end and directly coupled to the wiring board 510 on a second end opposite the first end, wherein the third antenna 540 is located on a third side of the wiring board 510 different from the first side and second side of the wiring board 510.

In addition, antenna module 500 may include an intermediate frequency (IF) integrated circuit (IC) with modem 512 for receiving and generating radio signals, IF routing 518 coupling the IF IC modem to the FPCs. The antenna module 500 may also include a first radio frequency (baseband) IC 522 on the first antenna 520, a second radio frequency (RF) IC 532 on the second antenna 530, and a third radio frequency IC 542 on the third antenna 540.

Figure 6:
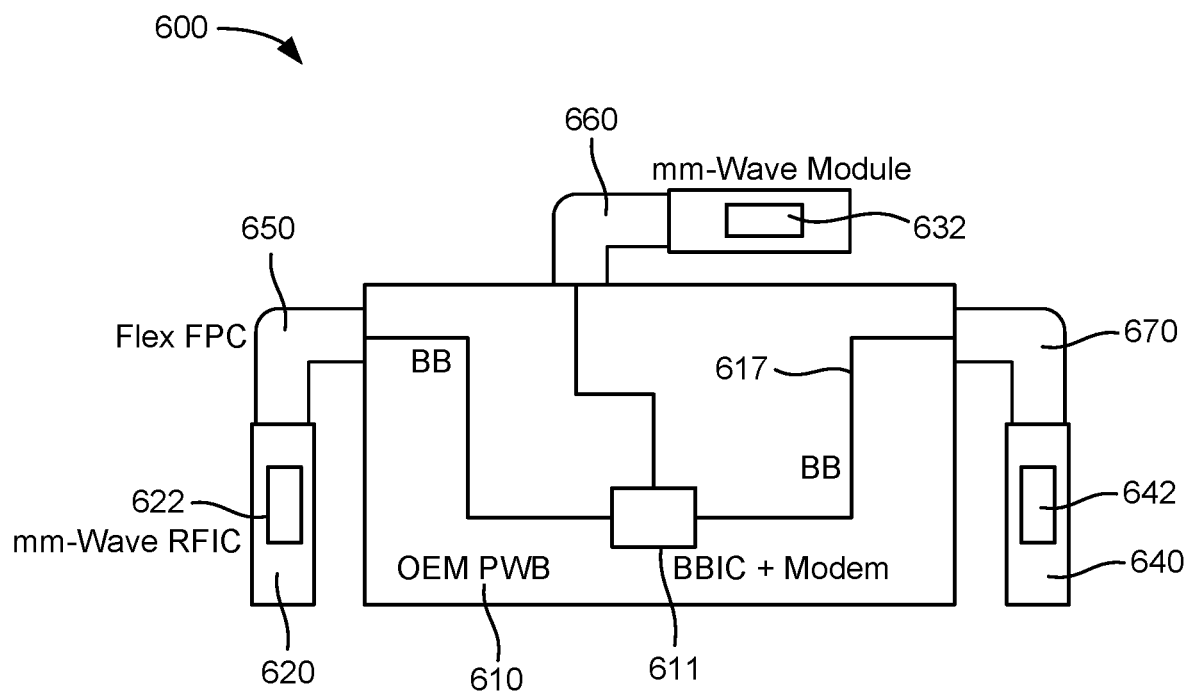
FIG. 6 illustrates an exemplary antenna module with a radio frequency IC on the antenna in accordance with some examples of the disclosure.

FIG. 6 illustrates an exemplary antenna module with a radio frequency IC on the antenna in accordance with some examples of the disclosure. As shown in FIG. 6, an antenna module 600 (e.g., antenna module 200) may include a wiring board 610, a first antenna 620, a second antenna 660, and a third antenna 640. The antenna module 600 may also include a first flexible printed circuit 660 (FPC) directly coupled to the first antenna 620 on a first end and directly coupled to the wiring board 610 on a second end opposite the first end; a second flexible printed circuit 660 directly coupled to the second antenna 630 on a first end and directly coupled to the wiring board 610 on a second end opposite the first end, wherein the second antenna 630 is located on a first side of the wiring board 610 and the first antenna 620 is located on a second side of the wiring board 610 different from the first side of the wiring board 610; and a third flexible printed circuit 670 directly coupled to the third antenna 640 on a first end and directly coupled to the wiring board 610 on a second end opposite the first end, wherein the third antenna 640 is located on a third side of the wiring board 610 different from the first side and second side of the wiring board 610.

In addition, antenna module 600 may include a baseband frequency (BB) integrated circuit (IC) with modem 611 for receiving and generating radio signals, BB routing 617 coupling the BB IC modem to the FPCs. The antenna module 600 may also include a first radio frequency (baseband) IC 622 on the first antenna 620, a second radio frequency (RF) IC 632 on the second antenna 630, and a third radio frequency IC 642 on the third antenna 640.

Figure 7:
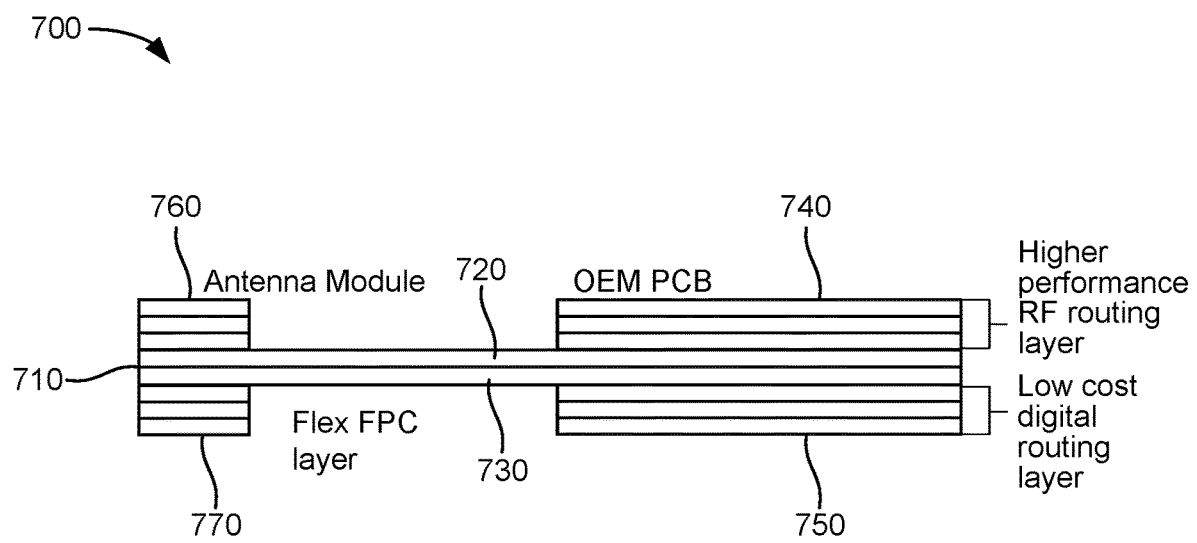
FIG. 7 illustrates an exemplary side view of an antenna module in accordance with some examples of the disclosure.

FIG. 7 illustrates an exemplary side view of an antenna module in accordance with some examples of the disclosure. As shown in FIG. 7, an antenna module 700 may include a copper layer 710 for routing signals, a first shield layer 720, a second shield layer 730 opposite the first shield layer 720, a ground layer on the second shield layer 730 (not shown), first high performance layers 740 on a first portion of the first shield layer 720, second high performance layers 760 on a second portion of the first shield layer 720, first digital routing layers 750 on a first portion of the second shield layer 730, and second digital routing layers 770 on a second portion of the second shield layer 730. The high performance layers 740 and the digital routing layers 750 may be rigid or more rigid than the flexible printed circuits and may include other components typically found on wiring boards such as a transceiver, modem, super heterodyne receiver (to down convert or up convert radio signals), redistribution layer, routing lines, and other circuit elements. The high performance layers 740 and 760 may allow high speed signal routing using matching dielectric constants between layers (low Dk less than 12), low profile copper traces (lower profile than traditional routing, roughness profile of less than 1.25 μm), and low dissipation factor resin (Df below 5). The low cost digital routing layers 750 and 770 may allow signal routing for non-RF signals.

Figure 8:
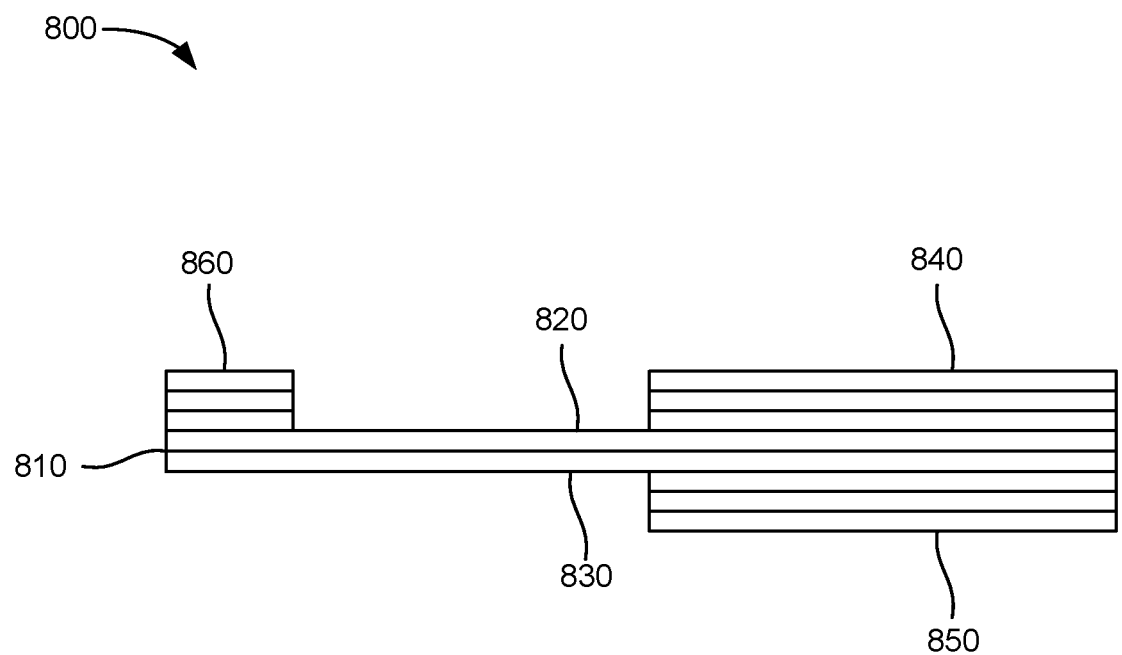
FIG. 8 illustrates an exemplary side view of an antenna module with high performance routing on the antenna in accordance with some examples of the disclosure.

FIG. 8 illustrates an exemplary side view of an antenna module with high performance routing on the antenna in accordance with some examples of the disclosure. As shown in FIG. 8, an antenna module 800 may include a copper layer 810 for routing signals, a first shield layer 820, a second shield layer 830 opposite the first shield layer 820, a ground layer on the second shield layer 830 (not shown), first high performance layers 840 on a first portion of the first shield layer 820, second high performance layers 860 on a second portion of the first shield layer 820, and first digital routing layers 850 on a first portion of the second shield layer 830. The high performance layers 840 and the digital routing layers 850 may be rigid or more rigid than the flexible printed circuits and may include other components typically found on wiring boards such as a transceiver, modem, super heterodyne receiver (to down convert or up convert radio signals), redistribution layer, routing lines, and other circuit elements. The high performance layers 840 and 860 may allow high speed signal routing using matching dielectric constants between layers (low Dk less than 12), low profile copper traces (lower profile than traditional routing, roughness profile of less than 1.25 μm), and low dissipation factor resin (Df below 5). The low cost digital routing layers 850 may allow signal routing for non-RF signals.

In the 840, 850 and 860 stack up, a thickness of the copper layers may be the same thickness to allow common shrinkage of the stack up while using both low cost and high cost materials. In addition, the second shield layer 830 may be on both sides or on the opposite side shown above the first shield layer 820 surface. In some examples, the shield layer(s) may be added on the top and bottom surfaces of the package. The shield layer(s) may be electromagnetic shielding film used to wrap or surround the flexible printed circuit. The electromagnetic shielding film may be used to keep unwanted signals from leaving the flexible printed circuit. The electromagnetic shielding film may be used to suppress noise coming from the flexible printed circuit, as well as be used to suppress noise coming from other surrounding components.

Figure 9:
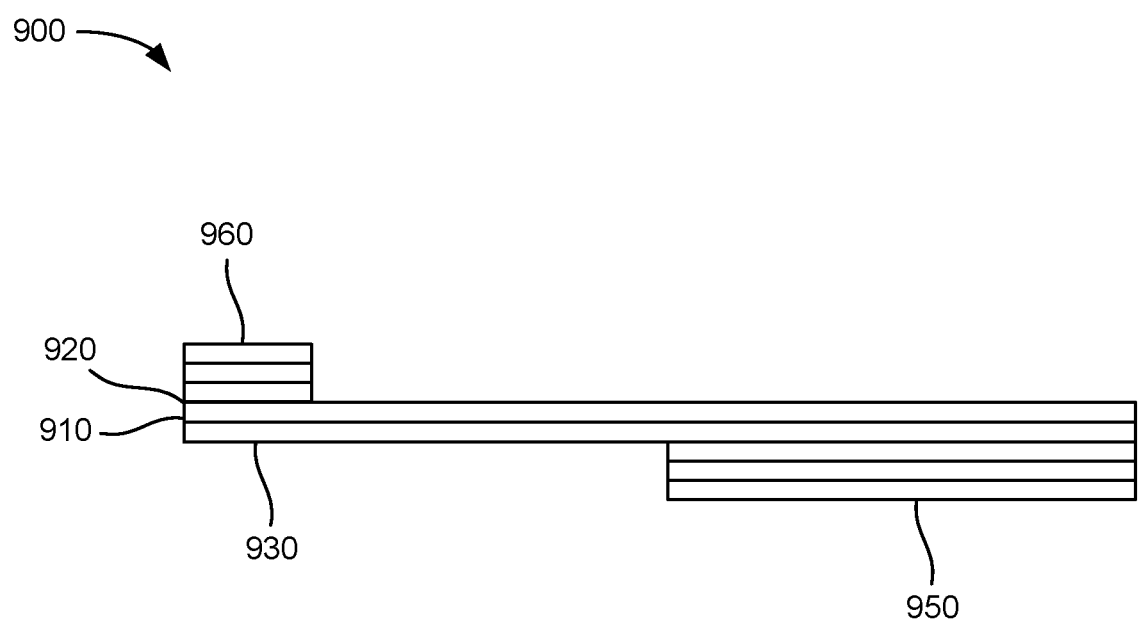
FIG. 9 illustrates an exemplary side view of an antenna module with high performance routing on the antenna in accordance with some examples of the disclosure.

FIG. 9 illustrates an exemplary side view of an antenna module with high performance routing on the antenna in accordance with some examples of the disclosure. As shown in FIG. 9, an antenna module 900 may include a copper layer 910 for routing signals, a first shield layer 920, a second shield layer 930 opposite the first shield layer 920, a ground layer on the second shield layer 930 (not shown), second high performance layers 960 on a second portion of the first shield layer 920, and first digital routing layers 950 on a first portion of the second shield layer 930. The digital routing layers 950 may be rigid or more rigid than the flexible printed circuits and may include other components typically found on wiring boards such as a transceiver, modem, super heterodyne receiver (to down convert or up convert radio signals), redistribution layer, routing lines, and other circuit elements. The high performance layers 960 may allow high speed signal routing using matching dielectric constants between layers (low Dk less than 12), low profile copper traces (lower profile than traditional routing, roughness profile of less than 1.25 μm), and low dissipation factor resin (Df below 5). The low cost digital routing layers 950 may allow signal routing for non-RF signals.

Figure 10:
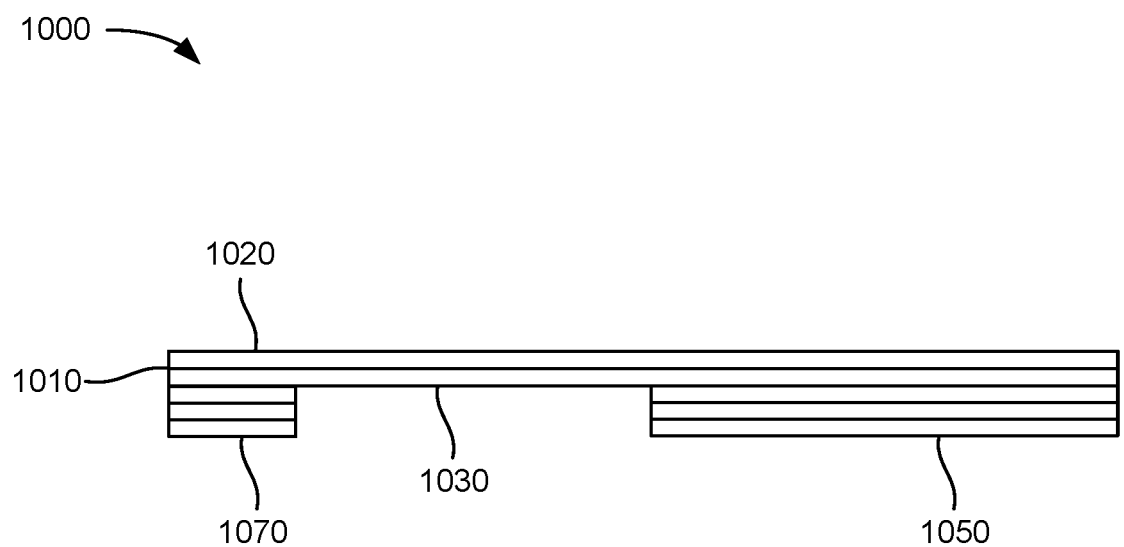
FIG. 10 illustrates an exemplary side view of an antenna module with low performance routing on the antenna in accordance with some examples of the disclosure.

FIG. 10 illustrates an exemplary side view of an antenna module with low performance routing on the antenna in accordance with some examples of the disclosure. As shown in FIG. 10, an antenna module 1000 may include a copper layer 1010 for routing signals, a first shield layer 1020, a second shield layer 1030 opposite the first shield layer 1020, a ground layer on the second shield layer 1030 (not shown), first digital routing layers 1050 on a first portion of the second shield layer 1030, and second digital routing layers 1070 on a second portion of the second shield layer 1030. The digital routing layers 1050 may be rigid or more rigid than the flexible printed circuits and may include other components typically found on wiring boards such as a transceiver, modem, super heterodyne receiver (to down convert or up convert radio signals), redistribution layer, routing lines, and other circuit elements. The low cost digital routing layers 1050 and 1070 may allow signal routing for non-RF signals.

Figure 11:
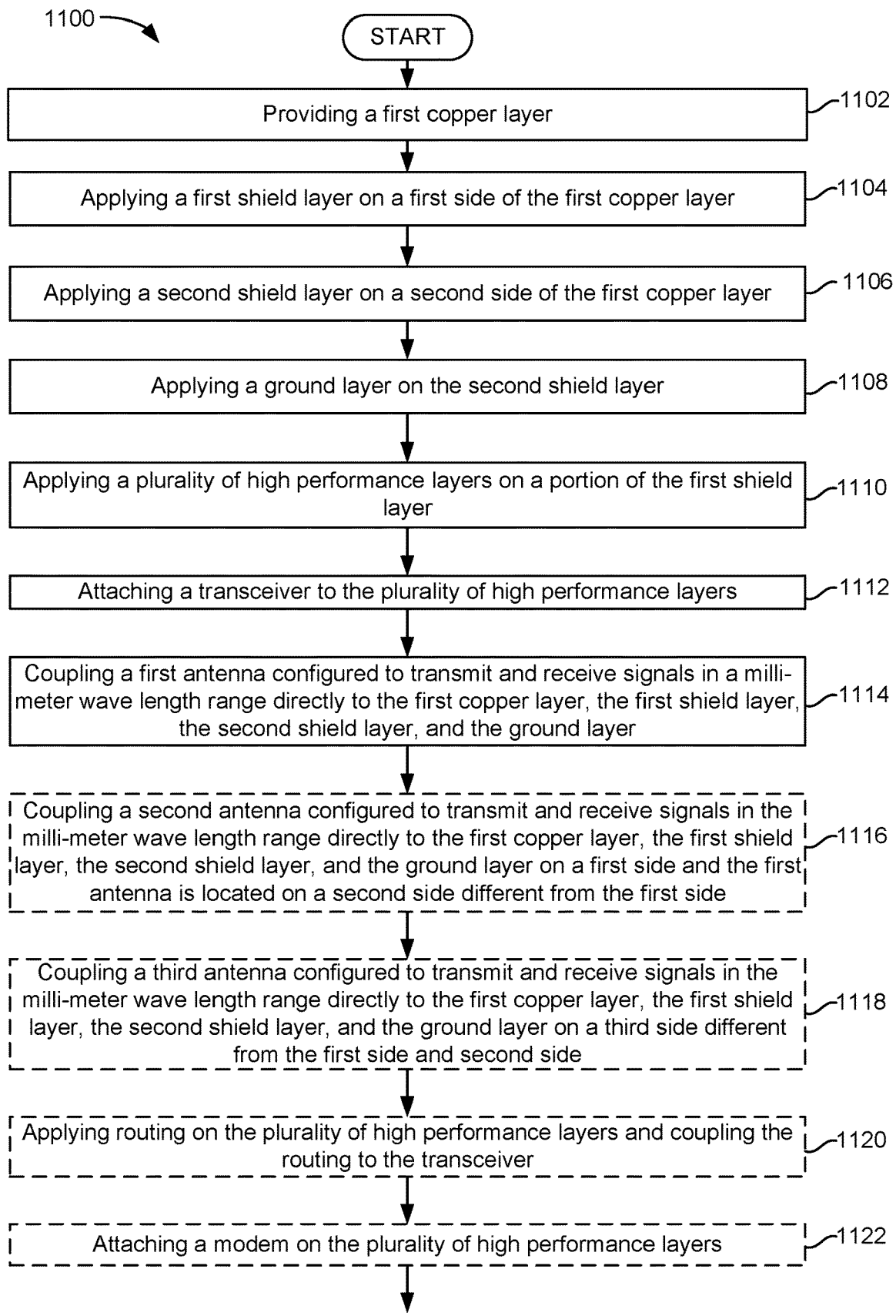
FIG. 11 illustrates an exemplary partial method in accordance with some examples of the disclosure.

FIG. 11 illustrates an exemplary partial method in accordance with some examples of the disclosure. As shown in FIG. 11, a partial method 1100 may being in block 1102 with providing a first copper layer. The partial method 1100 may continue in block 1104 with applying a first shield layer on a first side of the first copper layer. The partial method 1100 may continue in block 1106 with applying a second shield layer on a second side of the first copper layer. The partial method 1100 may continue in block 1108 with applying a ground layer on the second shield layer. The partial method 1100 may continue in block 1110 with applying a plurality of high performance layers on a portion of the first shield layer. The partial method 1100 may continue in block 1112 with attaching a transceiver to the plurality of high performance layers. The partial method 1100 may conclude in block 1114 with coupling a first antenna configured to transmit and receive signals in a millimeter wave length range directly to the first copper layer, the first shield layer, the second shield layer, and the ground layer.

Alternatively, the partial method 1100 may continue in block 1116 with coupling a second antenna configured to transmit and receive signals in the millimeter wave length range directly to the first copper layer, the first shield layer, the second shield layer, and the ground layer on a first side and the first antenna is located on a second side different from the first side. Alternatively, the partial method 1100 may continue in block 1118 with coupling a third antenna configured to transmit and receive signals in the millimeter wave length range directly to the first copper layer, the first shield layer, the second shield layer, and the ground layer on a third side different from the first side and second side. Alternatively, the partial method 1100 may continue in block 1120 with applying routing on the plurality of high performance layers and coupling the routing to the transceiver. Alternatively, the partial method 1100 may continue in block 1122 with attaching a modem on the plurality of high performance layers. In addition, the partial method 1100 may include the antenna module is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and the portion having the plurality of high performance layers is rigid and rectangular.

Figure 12:
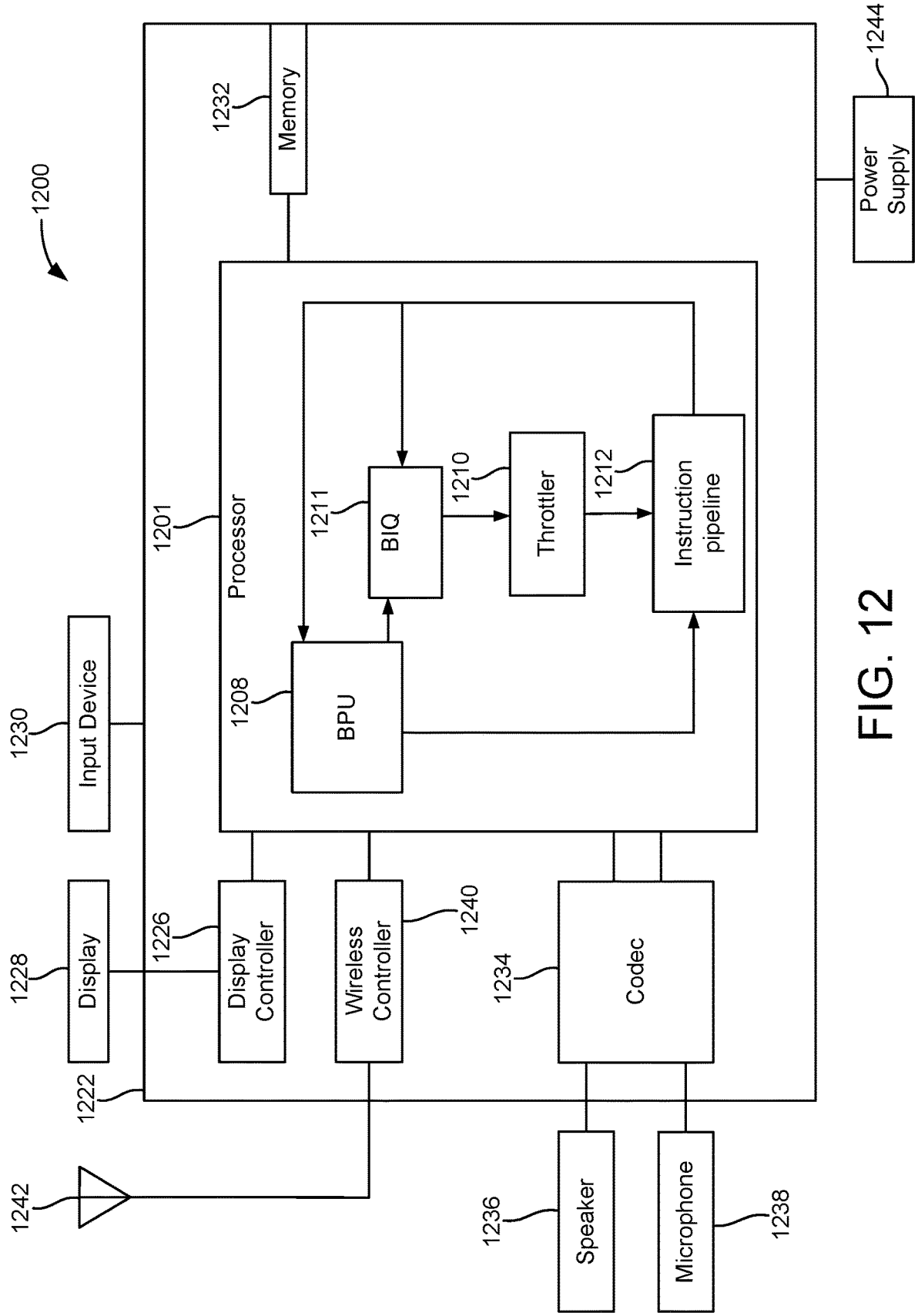
FIG. 12 illustrates an exemplary mobile device in accordance with some examples of the disclosure.

FIG. 12 illustrates an exemplary mobile device in accordance with some examples of the disclosure. Referring now to FIG. 12, a block diagram of a mobile device that is configured according to exemplary aspects is depicted and generally designated 1200. In some aspects, mobile device 1200 may be configured as a wireless communication device. As shown, mobile device 1200 includes processor 1201, which may be configured to implement the methods described herein in some aspects. Processor 1201 is shown to comprise instruction pipeline 1212, buffer processing unit (BPU) 1208, branch instruction queue (BIQ) 1211, and throttler 1210 as is well known in the art. Other well-known details (e.g., counters, entries, confidence fields, weighted sum, comparator, etc.) of these blocks have been omitted from this view of processor 1201 for the sake of clarity.

Processor 1201 may be communicatively coupled to memory 1232 over a link, which may be a die-to-die or chip-to-chip link. Mobile device 1200 also include display 1228 and display controller 1226, with display controller 1226 coupled to processor 1201 and to display 1228.

In some aspects, FIG. 12 may include coder/decoder (CODEC) 1234 (e.g., an audio and/or voice CODEC) coupled to processor 1201; speaker 1236 and microphone 1238 coupled to CODEC 1234; and wireless controller 1240 (which may include a modem) coupled to wireless antenna 1242 and to processor 1201.

In a particular aspect, where one or more of the above-mentioned blocks are present, processor 1201, display controller 1226, memory 1232, CODEC 1234, and wireless controller 1240 can be included in a system-in-package or system-on-chip device 1222. Input device 1230 (e.g., physical or virtual keyboard), power supply 1244 (e.g., battery), display 1228, input device 1230, speaker 1236, microphone 1238, wireless antenna 1242, and power supply 1244 may be external to system-on-chip device 1222 and may be coupled to a component of system-on-chip device 1222, such as an interface or a controller.

It should be noted that although FIG. 12 depicts a mobile device, processor 1201 and memory 1232 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 13:
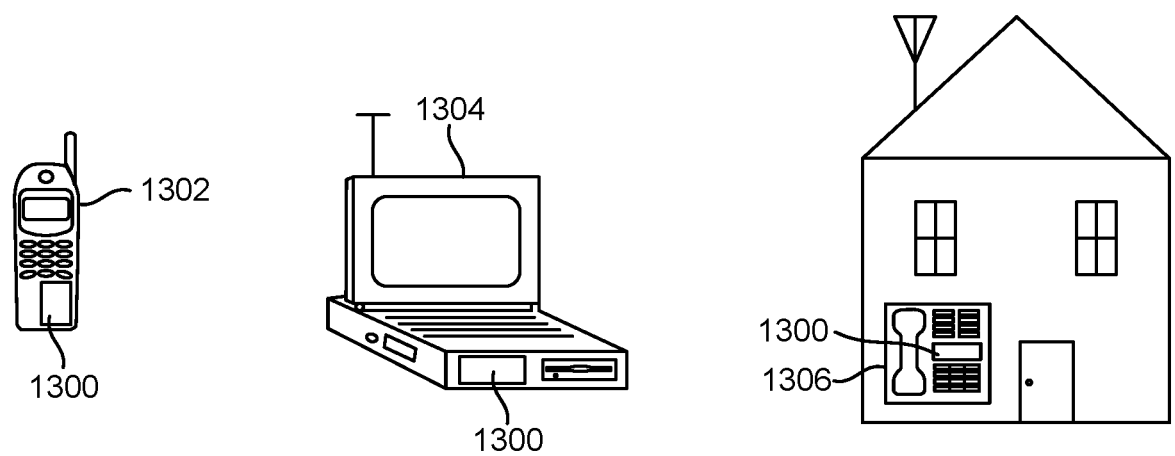
FIG. 13 illustrates various electronic devices that may be integrated with any of the aforementioned integrated device, semiconductor device, integrated circuit, die, interposer, package or package-on-package (PoP) in accordance with some examples of the disclosure.

FIG. 13 illustrates various electronic devices that may be integrated with any of the aforementioned integrated device, semiconductor device, integrated circuit, die, interposer, package or package-on-package (PoP) in accordance with some examples of the disclosure. For example, a mobile phone device 1302, a laptop computer device 1304, and a fixed location terminal device 1306 may include an integrated device 1300 as described herein. The integrated device 1300 may be, for example, any of the integrated circuits, dies, integrated devices, integrated device packages, integrated circuit devices, device packages, integrated circuit (IC) packages, package-on-package devices described herein. The devices 1302, 1304, 1306 illustrated in FIG. 13 are merely exemplary. Other electronic devices may also feature the integrated device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, an antenna module may comprise a wiring board; a transceiver attached to the wiring board; first means for transmitting and receiving signals in a millimeter wave length range (e.g., an antenna or antenna array); and first means for connection (e.g., a flexible printed circuit (FPC)) directly coupled to the first means for transmitting and receiving signals on a first end and directly coupled to the wiring board on a second end opposite the first end. It will be appreciated that the aforementioned aspects are merely provided as examples and the various aspects claimed are not limited to the specific references and/or illustrations cited as examples.

One or more of the components, processes, features, and/or functions illustrated in FIGS. 1-13 may be rearranged and/or combined into a single component, process, feature or function or incorporated in several components, processes, or functions. Additional elements, components, processes, and/or functions may also be added without departing from the disclosure. It should also be noted that FIGS. 1-13 and its corresponding description in the present disclosure is not limited to dies and/or ICs. In some implementations, FIGS. 1-13 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations). Additionally, these sequence of actions described herein can be considered to be incorporated entirely within any form of computer-readable storage medium having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A method for manufacturing an antenna module, the method comprising:
    attaching a first antenna to a first flexible printed circuit on a first end of the first flexible printed circuit, the first antenna being configured to transmit and receive signals in a millimeter wave length range;
    attaching a wiring board to the first flexible printed circuit on a second end of the first flexible printed circuit opposite the first end of the first flexible printed circuit, the wiring board having a transceiver attached thereon;
    attaching a second antenna to a second flexible printed circuit on a first end of the second flexible printed circuit, the second antenna being configured to transmit and receive signals in the millimeter wave length range; and
    attaching the wiring board to the second flexible printed circuit on a second end of the second flexible printed circuit opposite the first end of the second flexible printed circuit,
    wherein the second antenna is located on a first side of the wiring board and the first antenna is located on a second side of the wiring board different from the first side of the wiring board.

2. The method of claim 1, further comprising:
    attaching a third antenna to a third flexible printed circuit on a first end of the third flexible printed circuit, the third antenna being configured to transmit and receive signals in the millimeter wave length range; and
    attaching the wiring board to the third flexible printed circuit on a second end of the third flexible printed circuit opposite the first end of the third flexible printed circuit,
    wherein the third antenna is located on a third side of the wiring board different from the first side and second side of the wiring board.

3. The method of claim 1, wherein the first flexible printed circuit comprises a copper layer between a first shield layer and a second shield layer, and a ground layer on the second shield layer opposite the copper layer.

4. The method of claim 1, wherein the wiring board is rigid and rectangular.

5. The method of claim 1, further comprising attaching the first flexible printed circuit to the transceiver via routing on the wiring board.

6. The method of claim 1, further comprising forming electromagnetic shielding on the first flexible printed circuit.

7. The method of claim 1, further comprising:
disposing first radio frequency (RF) circuitry on the first end of the first flexible printed circuit, the first RF circuitry being coupled to the first antenna; and
disposing second RF circuitry on the first end of the second flexible printed circuit, the second RF circuitry being coupled to the second antenna.

\* \* \* \* \*